(12) United States Patent
Ma et al.

(10) Patent No.: US 12,202,763 B2
(45) Date of Patent: Jan. 21, 2025

(54) GRADIENT GLASS AND PREPARATION METHOD AND USE THEREOF

(71) Applicant: BYD COMPANY LIMITED, Guangdong (CN)

(72) Inventors: Lan Ma, Shenzhen (CN); Jisiyuan Cheng, Shenzhen (CN); Jingjie Yang, Shenzhen (CN); Liang Chen, Shenzhen (CN)

(73) Assignee: BYD COMPANY LIMITED, Shenzhen (CN)

( * ) Notice: Subject to any disclaimer, the term of this patent is extended or adjusted under 35 U.S.C. 154(b) by 564 days.

(21) Appl. No.: 17/427,327

(22) PCT Filed: Jan. 17, 2020

(86) PCT No.: PCT/CN2020/072711
§ 371 (c)(1),
(2) Date: Jul. 30, 2021

(87) PCT Pub. No.: WO2020/156235
PCT Pub. Date: Aug. 6, 2020

(65) Prior Publication Data
US 2022/0135469 A1    May 5, 2022

(30) Foreign Application Priority Data
Jan. 31, 2019    (CN) .......................... 201910099852.3

(51) Int. Cl.
*C03C 15/02*    (2006.01)
*H05K 5/03*    (2006.01)

(52) U.S. Cl.
CPC ............... *C03C 15/02* (2013.01); *H05K 5/03* (2013.01)

(58) Field of Classification Search
CPC ........................................ C03C 15/00–15/025
See application file for complete search history.

(56) References Cited

U.S. PATENT DOCUMENTS 2,018,422 A    10/1935    Yukitoshi et al.

FOREIGN PATENT DOCUMENTS

| CN | 102887647 A | 1/2013 | |
|---|---|---|---|
| CN | 103011610 A | 4/2013 | |
| CN | 104030574 A | 9/2014 | |
| CN | 108395111 A | * 8/2018 | |
| CN | 108515462 A | 9/2018 | |
| CN | 108724858 A | * 11/2018 | ........... B32B 17/064 |
| CN | 109206016 A | 1/2019 | |
| CN | 110304834 A | 10/2019 | |
| EP | 3868729 A1 | 8/2021 | |

(Continued)

OTHER PUBLICATIONS

Machine translation of CN108724858. Retrieved Jan. 10, 2024.*

(Continued)

*Primary Examiner* — Prashant J Khatri
(74) *Attorney, Agent, or Firm* — Calfee, Halter & Griswold LLP

(57) ABSTRACT

The present disclosure provides a gradient glass and a preparation method and use thereof. The gradient glass includes: a glass body, a haze of at least a part of an outer surface of the glass body being greater than 0, the haze gradually changing in a predetermined direction, and a light transmittance at any position of the glass body being greater than 85%.

10 Claims, 1 Drawing Sheet

(56) References Cited

FOREIGN PATENT DOCUMENTS

JP        S54113619 A     9/1979
JP        2017014041 A   1/2017

OTHER PUBLICATIONS

Machine translation of CN108395111. Retrieved Jul. 10, 2024.*
International Search Report of PCT/CN2020/072711 dated Apr. 14, 2020 (3 pages).

* cited by examiner

GRADIENT GLASS AND PREPARATION METHOD AND USE THEREOF

CROSS-REFERENCE TO RELATED APPLICATIONS

The present disclosure is the national stage of PCT Application No. PCT/CN2020/072711, filed on Jan. 17, 2020, which claims priority to and benefits of Chinese Patent Application No. 201910099852.3 filed on Jan. 31, 2019, which are incorporated herein by reference in their entireties.

FIELD

The present disclosure relates to the technical field of glass and the technical field of electronic devices, and specifically, to a gradient glass and a preparation method and use thereof.

BACKGROUND

With the rapid development of electronic devices, people have increasingly high requirements for both performance and appearance of the electronic devices. At present, to avoid the problem of signal shielding of a metal housing, a glass housing is increasingly used for an electronic device housing. Moreover, to meet different needs of users for fashion and personality, glass housings with various decorative effects have been developed. A glass with a gradient haze is favored by many users. However, at present, although the glass with a gradient haze achieves a gradient effect, a larger haze of the glass indicates stronger diffuse reflection of light and a lower light transmittance. When used in an electronic device that requires high optical performance, especially when used as a cover plate of the electronic device, the glass with a gradient haze is subject to many restrictions and consequently cannot meet use requirements. Therefore, how to improve the optical performance of the gradient glass is a problem to be resolved urgently.

SUMMARY

The present disclosure is to at least resolve one of the technical problems in the related art to some extent. Therefore, an objective of the present disclosure is to provide a gradient glass with a gradient effect and good optical performance, and a preparation method and use thereof.

In an aspect of the present disclosure, the present disclosure provides a gradient glass. According to an embodiment of the present disclosure, the gradient glass includes: a glass body, a haze of at least a part of an outer surface of the glass body being greater than 0, the haze gradually changing in a predetermined direction, and a light transmittance at any position of the glass body being greater than 85%. It is found that, while having a gradient effect, the gradient glass can achieve a relatively high light transmittance and can meet use requirements for an electronic device, and in particular, can meet use requirements for a cover plate of the electronic device, greatly expanding a use range of the gradient glass.

In another aspect of the present disclosure, the present disclosure provides a method for preparing the foregoing gradient glass. According to an embodiment of the present disclosure, the method includes: frosting at least a part of the outer surface of the glass body; and performing chemical polishing on the frosted outer surface. In the method, the frosting is performed first to form a concave-convex structure on the outer surface of the glass body, so that the outer surface of the glass body has a certain haze; and then the chemical polishing is performed to remove burrs on a surface of the concave-convex structure, so that the surface of the concave-convex structure becomes smooth or nearly smooth, thereby greatly reducing diffuse reflection, and greatly improving the light transmittance of the gradient glass.

In still another aspect of the present disclosure, the present disclosure provides an electronic device housing. According to an embodiment of the present disclosure, the electronic device housing includes the foregoing gradient glass. The electronic device housing includes all features and advantages of the foregoing gradient glass, which are not described herein again.

DETAILED DESCRIPTION

Figure 1:
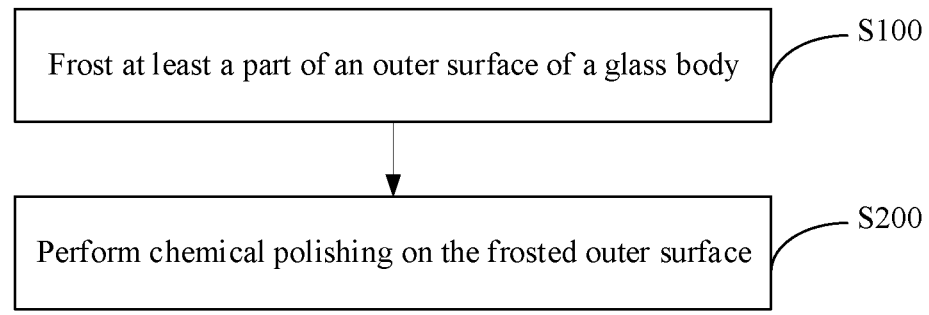
FIG. 1 is a schematic flowchart of a method for preparing a gradient glass according to an embodiment of the present disclosure.

Embodiments of the present disclosure are described in detail below. The following described embodiments are illustrative only for explaining the present disclosure, and are not to be construed as limiting the present disclosure. The embodiments in which specific technologies or conditions are not indicated shall be carried out in accordance with the technologies or conditions described in the literature in the art or in accordance with the product specification. The reagents or instruments for which no manufacturer is noted are all common products commercially available from the market.

In an aspect of the present disclosure, the present disclosure provides a gradient glass. According to an embodiment of the present disclosure, the gradient glass includes: a glass body, a haze of at least a part of an outer surface of the glass body being greater than 0, the haze gradually changing in a predetermined direction, and a light transmittance at any position of the glass body being greater than 85% (specifically 85%, 86%, 87%, 88%, 89%, 90%, 91%, 92%, 93%, 94%, 95%, or the like). It is found that, while having a gradient effect, the gradient glass can achieve a relatively high light transmittance and can meet use requirements for an electronic device, and in particular, can meet use requirements for a cover plate of the electronic device, greatly expanding a use range of the gradient glass.

It should be noted that, for the terms used in this specification, "light transmittance" refers to a percentage of a flux of light passing through the gradient glass to a flux of incident light; and "haze" refers to a percentage of an intensity of transmitted light that deviates from incident light by more than 2.5° to a total intensity of transmitted light; and for the description manner used in this specification, "predetermined direction" refers to a direction arbitrarily designated on the outer surface of the glass body, and a specific direction may be flexibly selected according to actual use needs, for example, the direction may be a direction from one end to another end of the glass body, or may be a direction at a certain angle to the foregoing direction.

According to an embodiment of the present disclosure, the shape and structure of the glass body are not particularly limited, and a person skilled in the art may flexibly select the shape and structure according to needs, for example, the glass body may be a plate glass, a 2.5D glass, a 3D glass, or the like, and the specific shape may be a square, a rectangle, a rounded rectangle, or another regular or irregular shape.

According to an embodiment of the present disclosure, the specific type of the glass body is not particularly limited, and may be selected according to a specific use field of the gradient glass, for example, when used as an electronic device housing (including a rear housing and a cover plate), the glass body includes, but is not limited to, an aluminosilicate glass, a borosilicate glass, a cover plate glass (including an aluminosilicate glass and a soda-lime-silica glass with high aluminum and high alkali), a touchscreen substrate glass (such as an alkaline earth boro-aluminosilicate glass, a sodium glass, and a neutral borosilicate glass that are free of alkali and heavy metals (arsenic, antimony, and barium)), a display substrate glass (such as an alkaline earth boro-aluminosilicate glass, a sodium glass, and a neutral borosilicate glass that are free of alkali and heavy metals (arsenic, antimony, and barium)), a TFT display screen substrate glass (such as an alkaline earth boro-aluminosilicate glass that is free of alkali and heavy metals (arsenic, antimony, and barium)), and the like.

According to an embodiment of the present disclosure, to make the haze of the outer surface of the glass body gradually transit and change uniformly and naturally, and make the glass body not show an apparent stepped shape, the haze of the entire outer surface of the glass body is greater than 0. Therefore, the haze of the entire outer surface can transit and change uniformly and naturally, and there is no apparent stepped shape at an interface between the surface with a haze greater than 0 and the surface that is smooth, so that the gradient glass has higher appearance quality and feels smooth and delicate.

According to an embodiment of the present disclosure, the haze of the glass body is generally achieved by forming a concave-convex structure on the outer surface of the glass body. Therefore, there is a concave-convex structure on the outer surface with the haze greater than 0 of the glass body. In the present disclosure, to improve the light transmittance of the gradient glass, a surface of the foregoing concave-convex structure is smooth or nearly smooth. Therefore, the smooth or nearly smooth surface can greatly weaken diffuse reflection, so that the gradient glass can achieve relatively high haze change and relatively high light transmittance at the same time. In addition, the surface of the concave-convex structure is relatively smooth and has no burrs, and can further improve mechanical performance of the obtained gradient glass and improve a use effect of the gradient glass.

According to an embodiment of the present disclosure, the thickness of the glass body may be 0.1 to 1.0 mm, specifically, 0.1 mm, 0.2 mm, 0.3 mm, 0.4 mm, 0.5 mm, 0.6 mm, 0.7 mm, 0.8 mm, 0.9 mm, and 1.0 mm, and the surface roughness RA of the outer surface of the glass body is not greater than 1 µm, specifically, 1 µm, 0.9 µm, 0.8 µm, 0.7 µm, 0.6 µm, 0.5 µm, 0.4 µm, 0.3 µm, 0.2 µm, and 0.1 µm. Therefore, the thickness of the glass body and the surface roughness of the outer surface can cooperate with each other, so that the mechanical performance is still good even when the thickness of the glass body is small, which can well meet use requirements of electronic devices. If the thickness is small, and the surface roughness is excessively large, the mechanical performance of the gradient glass may become poorer, such as fragile and low-strength, which affects the use effect.

According to an embodiment of the present disclosure, a gradient range of the haze of the gradient glass is not particularly limited, and may be selected according to actual use requirements. In some specific embodiments, in the predetermined direction, a difference between a maximum value of the haze and a minimum value of the haze may be 1% to 99%, that is, in the predetermined direction, the haze may gradually change from 1% to 2%, 5%, 10%, 15%, 20%, 25%, 30%, 35%, 40%, 45%, 50%, 55%, 60%, 65%, 70%, 75%, 80%, 85%, 90%, 95%, and 100%. In some specific embodiments, in the predetermined direction, a difference between a maximum value of the haze and a minimum value of the haze may be 20% to 80%. Therefore, a haze gradient effect is clear, and the haze gradually changes uniformly and naturally, which can be used in a wider range of fields and meet use requirements of more use environments.

Figure 2:
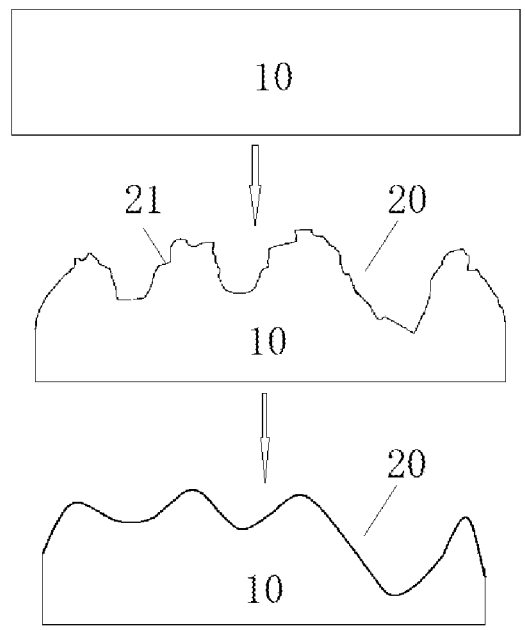
FIG. 2 is a schematic structural diagram of products in steps in a process of preparing a gradient glass according to an embodiment of the present disclosure.

In another aspect of the present disclosure, the present disclosure provides a method for preparing the foregoing gradient glass. According to an embodiment of the present disclosure, referring to FIG. 1 and FIG. 2, the method includes the following steps:

S100. Frost at least a part of an outer surface of a glass body 10.

According to an embodiment of the present disclosure, in this step, the outer surface of the glass body may be processed by using a frosting solution, and the frosting solution that may be used may be an acid solution, and may be specifically an acid solution containing one or more of ammonium hydrogen fluoride, ammonium fluoride, potassium fluoride, and barium sulfate; and a specific processing method may be to immerse the glass body in the frosting solution. In most cases, when the frosting solution has a specific concentration, a longer time for which the frosting solution is in contact with the outer surface of the glass body indicates stronger sandiness of the outer surface of the glass body and a larger haze. Therefore, in this step, the concentration and the composition of the frosting solution, and the time of contact with the glass body may be adjusted to form different hazes and achieve a haze gradient effect, and a specific concentration and contact time may be flexibly adjusted and selected according to a target haze.

According to an embodiment of the present disclosure, in this step, the glass body taken out of the frosting solution may be further cleaned and dried, for example, the glass body may be processed by using a large amount of pure water to remove the residual acid solution on the glass body, and then the glass body may be dried, for example, dried in a thermostatic incubator.

S200. Perform chemical polishing on the frosted outer surface.

According to an embodiment of the present disclosure, a concave-convex structure 20 is formed on the outer surface of the frosted glass body 10, so that the surface has a certain roughness, and thus has a certain haze. However, burrs 21 are formed on the surface of the concave-convex structure 20 only by frosting, that is, the surface of the concave-convex structure is also a rough surface. Therefore, the diffuse reflection of the obtained gradient glass is relatively strong, and the light transmittance is greatly reduced. In this step, chemical polishing is performed on the frosted outer surface by using a chemical polishing solution. On the one hand, the roughness of the outer surface of the glass body can be reduced to further adjust the haze, and the mechanical performance of the glass body can be ensured when the thickness of the glass body is small to meet use requirements for the relatively thin gradient glass. On the other hand, the burrs 21 on the surface of the concave-convex structure can be effectively removed by chemical polishing, so that the surface of the concave-convex structure is smooth or nearly smooth, and optical performance, especially the light transmittance, of the glass is improved, and thus the gradient glass can meet the requirements of the optical performance for a cover plate of an electronic device.

According to an embodiment of the present disclosure, in this step, the polishing may be performed by using a conventional chemical polishing method. Specifically, the chemical polishing solution that may be used includes, but is not limited to, a hydrofluoric acid solution and a mixed aqueous solution of hydrofluoric acid and sulfuric acid, and a specific processing method may be to immerse the glass body in the chemical polishing solution, or may be to spray the chemical polishing solution on the outer surface of the glass body. In a certain range, a higher concentration of the chemical polishing solution and a longer time of contact with the glass body indicate that the roughness RA of the outer surface of the frosted glass body decreases more, and the haze decreases more. Therefore, in this step, the concentration of the chemical polishing solution and the time of contact with the glass body may be flexibly adjusted according to actual use requirements of the gradient glass to obtain the gradient glass with the required haze and light transmittance.

According to an embodiment of the present disclosure, in this step, the glass body taken out of the chemical polishing solution may be further cleaned and dried, for example, the glass body may be processed by using a large amount of pure water to remove the residual acid solution on the glass body, and then the glass body may be dried, for example, dried in a thermostatic incubator.

According to a specific embodiment of the present disclosure, the glass body includes a first end and a second end opposite to each other, and the method includes: gradually immersing the glass body in a frosting solution in a direction from the first end to the second end according to a first predetermined rate, and taking out the glass body after the glass body is completely immersed in the frosting solution, to obtain the frosted glass body; and gradually immersing the frosted glass body in a chemical polishing solution in a direction from the second end to the first end according to a second predetermined rate, and taking out the glass body after the glass body is completely immersed in the chemical polishing solution. Therefore, in the step of frosting, in the direction from the first end to the second end, a reaction time of the glass body and the frosting solution is changed from long to short, so that the roughness and haze of the outer surface of the glass body are uniformly changed from large to small; and finally, the entire glass body is immersed in the frosting solution, the haze and roughness of the entire outer surface change uniformly and naturally, and there is no apparent stepped shape. In the step of chemical polishing, a contact time of the first end of the glass body and the chemical polishing solution is the shortest, the haze decreases the least, the gradient effect is enhanced, and the obtained gradient glass can achieve the gradient of 100% to 1% from the first end to the second end.

According to another specific embodiment of the present disclosure, the glass body includes a first end and a second end opposite to each other, and the method includes: directly immersing the entire glass body in a frosting solution for a first predetermined time, and then taking out, to uniformly frost the outer surface of the glass body, and to obtain the frosted glass body; and gradually immersing the frosted glass body in a chemical polishing solution in a direction from the second end to the first end according to a third predetermined rate, and taking out the glass body after the glass body is completely immersed in the chemical polishing solution. In this method, in the step of frosting, the entire glass body is directly and quickly immersed in the frosting solution, that is, different positions on the outer surface of the glass body are basically immersed in the frosting solution at the same time, thereby forming the uniform concave-convex structure. However, the contact time of the frosted glass body and the chemical polishing solution is different, so that the haze of the outer surface of the glass body continuously changes to form the gradient effect.

According to another specific embodiment of the present disclosure, the glass body includes a first end and a second end opposite to each other, and the method includes: gradually immersing the glass body in a frosting solution in a direction from the first end to the second end according to a fourth predetermined rate, and taking out the glass body after the glass body is completely immersed in the frosting solution, to obtain the frosted glass body; and directly immersing the entire frosted glass body in a chemical polishing solution for a second predetermined time, and then taking out. In this method, in the step of frosting, the contact time of the glass body and the frosting solution is different, and the haze gradually increases in the direction from the first end to the second end; and in the step of chemical polishing, the entire glass body is directly and quickly immersed in the chemical polishing solution, that is, different positions on the outer surface of the glass body are basically immersed in the chemical polishing solution at the same time, so that the haze at different positions is basically reduced the same, and the gradient glass with the gradient haze is finally formed.

According to an embodiment of the present disclosure, the foregoing first predetermined rate, second predetermined rate, third predetermined rate, and fourth predetermined rate are not particularly limited and may be flexibly selected according to the actually required haze, the size and composition of the glass body, the types and concentrations of the used frosting solution and chemical polishing solution, and the foregoing first predetermined time and second predetermined time are not particularly limited either and may be flexibly selected according to the actually required haze, the size and composition of the glass body, the type and concentration of the used frosting solution and chemical polishing solution, which are not described herein again.

In the method of the present disclosure, the frosting is performed first to form a concave-convex structure on the outer surface of the glass body, so that the outer surface of the glass body has a certain haze; and then the chemical polishing is performed to remove burrs on a surface of the concave-convex structure, so that the surface of the concave-convex structure becomes smooth or nearly smooth, thereby greatly reducing diffuse reflection, and greatly improving the light transmittance of the gradient glass.

In still another aspect of the present disclosure, the present disclosure provides an electronic device housing. According to an embodiment of the present disclosure, the electronic device housing includes the foregoing gradient glass. The electronic device housing includes all features and advantages of the foregoing gradient glass, which are not described herein again.

According to an embodiment of the present disclosure, the electronic device housing may be a rear housing of the electronic device, or may be a cover plate of the electronic device, such as a front cover plate of a mobile phone or a tablet computer, and a specific shape and structure of the electronic device housing may be selected according to needs of an actual product.

In still another aspect of the present disclosure, the present disclosure provides an electronic device. According to an embodiment of the present disclosure, the electronic device includes the foregoing electronic device housing. The electronic device includes all features and advantages of the foregoing gradient glass and electronic device housing, which are not described herein again.

According to an embodiment of the present disclosure, the specific type of the electronic device is not particularly limited, and for example, includes but is not limited to, a display, a mobile phone, a tablet computer, a wearable device, and a game console. In addition, a person skilled in the art may understand that, in addition to the foregoing gradient glass or housing, the electronic device further includes structures and components necessary for a conventional electronic device. Using a mobile phone as an example, the electronic device may further include a display screen, a touchscreen, a CPU, a fingerprint recognition module, a camera module, a sound processing system, a necessary circuit structure, and the like.

Examples of the present disclosure are described in detail below.

Example 1

An aluminosilicate glass with a thickness of 0.6 mm, a length of 160 mm, and a width of 75 mm was used. The glass was cleaned, a surface of the glass was covered with acid-resistant ink, an end A of the glass was fixed, an end B (another end opposite to the end A) was lowered at a rate of 1.2 mm/s until the entire glass was immersed in a frosting solution (an aqueous solution of ammonium hydrogen fluoride with a mass ratio of 25%, potassium fluoride with a mass ratio of 5%, and barium sulfate with a mass ratio of 8%), and then the glass was rapidly pulled out of the solution and washed with a large amount of water. A gradient frosting effect was achieved on the surface of the glass. For the end A, the surface roughness RA was 0.15 and the haze was 35% (the test method is as follows: vertically irradiating the gradient glass by using a beam of parallel light from a standard illuminant C, and detecting a percentage of a ratio of a flux Td of scattered light that deviates from a direction of incident light by more than 2.5° to a flux T2 of light passing through the gradient glass; and the test method for all hazes in this specification is the same). For the end B, the surface roughness RA was 0.35 and the haze was 90%. The end B of the glass was then fixed, the end A was immersed in a chemical polishing acid solution (an aqueous solution containing 5 wt % of hydrofluoric acid and 2 wt % of sulfuric acid) at a rate of 0.2 mm/s until the glass was completely immersed in the chemical polishing acid solution, and then the glass was rapidly pulled out of the solution, washed with a large amount of water, and dried. For the end A, the surface roughness RA was reduced to 0.1 and the haze was 5%. For the end B, the surface roughness RA was reduced to 0.32 and the haze was 82%. Transmittance was tested multiple times at each of the end A, the end B, the position between the end A and the end B of an obtained gradient glass 1, and the minimum value of the transmittance in the multiple tests was 88%.

Example 2

An aluminosilicate glass with a thickness of 0.6 mm, a length of 160 mm, and a width of 75 mm was used. The glass was cleaned, the entire glass was directly immersed in a frosting acid solution (an aqueous solution of ammonium hydrogen fluoride with a mass ratio of 30%, potassium fluoride with a mass ratio of 5%, and barium sulfate with a mass ratio of 8%) to evenly corrode the glass, a sand surface effect of the surface roughness RA of 0.4 μm and the haze of 99% was achieved for the glass, and the glass was washed and dried for use. An end A of the glass was fixed, an end B (another end opposite to the end A) was lowered at a rate of 0.12 mm/s until the glass was completely immersed in a chemical polishing acid solution (an aqueous solution containing 5 wt % of hydrofluoric acid and 2 wt % of sulfuric acid), and then the glass was rapidly pulled out of the solution and washed with a large amount of water. For the end A, the surface roughness RA was 0.36 and the haze was 90%. For the end B, the surface roughness was 0.1 and the haze was 15%. Uniform gradient etching on the entire surface was achieved. Transmittance was tested multiple times at each of the end A, the end B, the position between the end A and the end B of an obtained gradient glass 2, and the minimum value of the transmittance in the multiple tests was 90%.

Example 3

An aluminosilicate glass with a thickness of 0.6 mm, a length of 160 mm, and a width of 75 mm was used. The glass was cleaned, a surface of the glass was covered with acid-resistant ink, an end A of the glass was fixed, an end B (another end opposite to the end A) was lowered at a rate of 1.2 mm/s until the entire glass was immersed in a frosting solution (an aqueous solution of ammonium hydrogen fluoride with a mass ratio of 30%, potassium fluoride with a mass ratio of 5%, and barium sulfate with a mass ratio of 8%), and then the glass was rapidly pulled out of the solution and washed with a large amount of water. A gradient frosting effect was achieved on the surface of the glass. For the end A, the surface roughness RA was 0.15 and the haze was 35%. For the end B, the surface roughness RA was 0.35 and the haze was 90%. The entire glass was then immersed in a chemical polishing acid solution (an aqueous solution containing 5 wt % of hydrofluoric acid and 2 wt % of sulfuric acid) for 10 min. For the end A, the surface roughness RA was 0.12 and the haze was 8%. For the end B, the surface roughness RA was 0.2 and the haze was 60%. Transmittance was tested multiple times at each of the end A, the end B, the position between the end A and the end B of an obtained gradient glass 3, and the minimum value of the transmittance in the multiple tests was 91%.

Comparative Example 1

An aluminosilicate glass with a thickness of 0.6 mm, a length of 160 mm, and a width of 75 mm was used. The glass was cleaned, a surface of the glass was covered with acid-resistant ink, an end A of the glass was fixed, an end B (another end opposite to the end A) was lowered at a rate of 1.2 mm/s until the entire glass was immersed in a frosting solution (an aqueous solution of ammonium hydrogen fluoride with a mass ratio of 30%, potassium fluoride with a mass ratio of 5%, and barium sulfate with a mass ratio of 8%), and then the glass was rapidly pulled out of the solution and washed with a large amount of water. A gradient frosting effect was achieved on the surface of the glass. For the end A, the surface roughness RA was 0.15 and the haze was 35%. For the end B, the surface roughness RA was 0.35 and the haze was 90%. Transmittance was tested multiple times at each of the end A, the end B, the position between the end A and the end B of an obtained gradient glass D1, and the minimum value of the transmittance in the multiple tests was 68%.

Performance Test:

The gradient glasses 1 to 3 and D1 obtained in Examples 1 to 3 and Comparative Example 1 were chemically strengthened, and then the strengthened gradient glasses 1 to 3 and D1 were subjected to a drop ball test and a surface stress test.

The specific test steps of the drop ball test are as follows: a steel ball (32 g) is dropped onto a center of the gradient glass from the heights of 65 cm, 65 cm, 70 cm, 75 cm, 80 cm, and 85 cm, the test is performed five times at each height, and if the gradient glass is not broken after the drop ball test at the height of 85 cm, the gradient glass is considered to meet the requirements.

The surface stress test is carried out by using a surface stress tester. The surface stress standard that meets the requirements is as follows: 680 MPa≤surface compressive stress (CS)≤850 MPa, 8 μm≤depth of layer (DOL)≤10 μm, 70 MPa compressive stress at a knee (CSK)≤110 MPa, 100 μm≤depth of compression (DOC)≤115 μm, and 44 MPa≤central tension (CT)≤95 MPa.

Results of the Performance Test:

| Test item | DOL (μm) | DOC (μm) | CS (MPa) | CSK (MPa) | CT (MPa) | Drop ball test |
|---|---|---|---|---|---|---|
| | | | Surface stress test | | | |
| Example 1 | 8.71 | 108.6 | 846.6 | 92.7 | 62.1 | Not broken at 85 cm |
| Example 2 | 8.55 | 109.5 | 840.8 | 98.7 | 64.9 | Not broken at 85 cm |
| Example 3 | 8.58 | 108.7 | 850.1 | 94.4 | 63 | Not broken at 85 cm |
| Comparative Example 1 | — | — | — | — | — | Broken at 40 cm |

Note:
"—" represents no test.

It can be learned from the foregoing tests that the chemically strengthened gradient glass according to the examples of the present disclosure has the surface stress that meets the requirements, can meet the use requirements of an electronic cover plate glass and a housing, and has better mechanical performance, while the gradient glass that is only frosted in Comparative Example 1 has poorer mechanical performance.

In the description of the present disclosure, it can be understood that terms "first" and "second" are used only for the purpose of description, and shall not be construed as indicating or implying relative importance or implying the quantity of indicated technical features. Therefore, features defining "first" and "second" may explicitly or implicitly include one or more such features. In the description of the present disclosure, the meaning of "multiple" is two or more unless specifically defined otherwise.

In the description of this specification, reference to the description of the terms "one embodiment", "some embodiments", "examples", "specific examples", or "some examples", etc. means that specific features, structures, materials, or characteristics described in combination with the embodiment or example are included in at least one embodiment or example of the present disclosure. In this specification, schematic representations of the foregoing terms are not necessarily directed to the same embodiment or example. Moreover, the specific features, structures, materials, or characteristics described may be combined in any one or more embodiments or examples in a suitable manner. In addition, different embodiments or examples described in this specification, as well as features of different embodiments or examples, may be integrated and combined by a person skilled in the art without contradicting each other.

Although the embodiments of the present disclosure have been shown and described above, it can be understood that, the foregoing embodiments are exemplary and cannot be understood as limitation to the present disclosure. A person of ordinary skill in the art can make changes, modifications, replacements, or variations to the foregoing embodiments within the scope of the present disclosure.

What is claimed is:

1. A chemically strengthened gradient glass, comprising:
a glass body, a haze of at least a part of an outer surface of the glass body being greater than 0, the haze gradually changing in a predetermined direction, and a light transmittance at any position of the glass body being greater than 85%,
wherein in the predetermined direction, a difference between a maximum value of the haze and a minimum value of the haze is 20% to 80%, and wherein the glass body has a surface compressive stress (CS) of greater than or equal to 680 MPa and less than or equal to 850 MPa and a depth of layer (DOL) of greater than or equal to 8 μm and less than or equal to 10 μm.

2. The gradient glass according to claim 1, wherein a haze of the entire outer surface of the glass body is greater than 0.

3. The gradient glass according to claim 2, wherein there is a concave-convex structure on the outer surface with the haze greater than 0 of the glass body, and a surface of the concave-convex structure is smooth or nearly smooth.

4. The gradient glass according to claim 3, wherein the thickness of the glass body is 0.1 to 1.0 mm, and the surface roughness RA of the outer surface of the glass body is not greater than 1 μm.

5. The gradient glass according to claim 2, wherein the thickness of the glass body is 0.1 to 1.0 mm, and the surface roughness RA of the outer surface of the glass body is not greater than 1 μm.

6. The gradient glass according to claim 1, wherein there is a concave-convex structure on the outer surface with the haze greater than 0 of the glass body, and a surface of the concave-convex structure is smooth or nearly smooth.

7. The gradient glass according to claim 6, wherein the thickness of the glass body is 0.1 to 1.0 mm, and the surface roughness RA of the outer surface of the glass body is not greater than 1 μm.

8. The gradient glass according to claim 1, wherein the thickness of the glass body is 0.1 to 1.0 mm, and the surface roughness RA of the outer surface of the glass body is not greater than 1 μm.

9. The gradient glass according to claim 1, wherein the haze gradually changes in the predetermined direction to 40% or more.

10. An electronic device housing, comprising the gradient glass according to claim 1.

* * * * *